(12) United States Patent
Crafts

(10) Patent No.: US 6,269,466 B1
(45) Date of Patent: *Jul. 31, 2001

(54) METHOD OF CONSTRUCTING AN INTEGRATED CIRCUIT UTILIZING MULTIPLE LAYERS OF INTERCONNECT

(75) Inventor: Harold S. Crafts, Colorado Springs, CO (US)

(73) Assignee: Hyundai Electronics America, San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/837,589

(22) Filed: Apr. 21, 1997

Related U.S. Application Data

(62) Division of application No. 08/455,503, filed on May 31, 1995, now Pat. No. 5,671,397, which is a division of application No. 08/174,654, filed on Dec. 27, 1993, now abandoned.

(51) Int. Cl.[7] .................................................... G06F 17/50
(52) U.S. Cl. ..................................... 716/1; 716/8; 716/12
(58) Field of Search ................................... 364/488–491; 395/500.03, 500.09, 500.1, 500.11, 500.12, 500.4; 716/1, 2, 8, 12

(56) References Cited

U.S. PATENT DOCUMENTS

| | | | |
|---|---|---|---|
| 4,143,178 | 3/1979 | Harada et al. ........................ | 427/85 |
| 4,151,635 | 5/1979 | Kashkooli et al. ................... | 29/571 |
| 4,229,756 | 10/1980 | Sata et al. ............................. | 357/42 |
| 4,244,001 | 1/1981 | Ipri ........................................ | 357/44 |
| 4,317,690 | 3/1982 | Koomen et al. ..................... | 148/187 |
| 4,525,809 | 6/1985 | Chiba et al. .......................... | 365/51 |
| 4,584,653 | 4/1986 | Chih et al. ........................... | 364/491 |
| 4,593,205 | 6/1986 | Bass et al. ........................... | 307/269 |
| 4,630,219 | 12/1986 | DiGiacomo et al. ............... | 364/488 |
| 4,638,458 | 1/1987 | Itoh ...................................... | 365/51 |
| 4,682,202 | 7/1987 | Tanizawa ............................. | 357/45 |
| 4,686,758 | 8/1987 | Liu et al. ............................. | 437/34 |
| 4,701,642 | 10/1987 | Pricer .................................. | 307/446 |
| 4,845,544 | 7/1989 | Shimizu .............................. | 357/71 |
| 4,849,344 | 7/1989 | Desbiens et al. .................... | 437/31 |
| 4,905,073 | 2/1990 | Chen et al. .......................... | 357/67 |
| 4,989,062 | 1/1991 | Takahashi et al. ................... | 357/45 |
| 4,999,518 | 3/1991 | Dhong et al. ....................... | 307/446 |
| 5,003,199 | 3/1991 | Chuang et al. ..................... | 307/446 |
| 5,008,208 | 4/1991 | Liu et al. ............................. | 437/31 |
| 5,013,679 | 5/1991 | Kumagai et al. ................... | 437/52 |
| 5,032,530 | 7/1991 | Lowrey et al. ..................... | 437/34 |
| 5,037,766 | 8/1991 | Wang .................................. | 437/24 |
| 5,045,726 | 9/1991 | Leung ................................. | 307/466 |
| 5,049,515 | 9/1991 | Tzeng ................................. | 437/43 |
| 5,081,518 | 1/1992 | El-Diwany et al. ................. | 357/59 |
| 5,124,776 | 6/1992 | Tanizawa et al. ................... | 357/45 |
| 5,126,279 | 6/1992 | Roberts ............................... | 437/52 |
| 5,162,884 | 11/1992 | Liou et al. ........................... | 257/384 |
| 5,168,072 | 12/1992 | Moslehi .............................. | 437/41 |
| 5,175,118 | 12/1992 | Yoneda ............................... | 437/40 |

(List continued on next page.)

OTHER PUBLICATIONS

Bachelu et al "A Study of the Use of Local Interconnect in CMOS Leaf Cell Design," IEEE, pp. 566–570, Dec. 1, 1993.*

Bachelu et al "A Study of the Use of Local Interconnect in CMOS Leaf Cell Design," IEEE, pp. 1258–1261, 1992.*

Bartelink et al "Interconnect for Submicron ASICS," IEEE, pp. 59–62, 1989.*

Hsieh et al "Size Optimization for CMOS Basic Cells of VLSI," iIEEE, pp. 2180–2183, Apr. 1991.*

Perello et al "Dependence of Spice Level 3 Model Parameters with Transistor Size," IEEE, pp. 84–89, Mar. 1992.*

Chang et al "Prompt3—A Cell–Based Transistor Sizing Program Using Heuristic and Simulated Annealing Algorithms," IEEE, pp. 17.2.1–17.2.4, May 1989.*

IBM Technical Disclosure Bulletin; vol. 25, No. 4; Sep. 1982; Structured Macro; E.H. Stoops.

An Efficient Algorithm for Some Multirow Layout Problems; J. Feldman et al.; IEEE Transactions on Computer–Aided Design of Integrated Circuits & Systems; vol. 12, No. 8, Aug. 1993; pp. 1178–1185.

10K–Gate GaAs JFET Sea of Gates; H. Kawasaki et al.; IEEE Journal of Solid–State Circuits; vol. 26, No. 10; Oct. 1991; pp. 1367–1370.

Application of AIGaAs/GaAs HBT's to High–Speed CML Logic Family Fabrication; M. Madihian et al.; IEEE Transactions on Electron Devices, Vo. 36, No. 4, Apr. 1989; pp. 625–631.

Combining Partitioning and Global Routing in a Sea–of–Cells Design; B. Korte et al., IEEE Computer–Aided Design; 1989 International Conference; pp. 98–101.

A Comprehensive CAD System for High–Performance 300K–Circuit ASIC Logic Chips; J. Panner et al.; IEEE Journal of Solid–State Circuits; vol. 26, No. 3; Mar. 1991; pp. 300–309.

(List continued on next page.)

Primary Examiner—Matthew Smith
Assistant Examiner—Vuthe Siek
(74) Attorney, Agent, or Firm—Townsend and Townsend and Crew LLP

(57) ABSTRACT

The invention concerns integrated circuits in which a MACRO is embedded in a standard cell array. One level of metal is devoted exclusively to non-local interconnect, and a layer of polysilicon is devoted to local interconnect, thereby saving significant space.

6 Claims, 12 Drawing Sheets

U.S. PATENT DOCUMENTS

| | | | |
|---|---|---|---|
| 5,225,991 | * | 7/1993 | Dougherty .......................... 364/491 |
| 5,294,822 | | 3/1994 | Verrett ................................. 257/368 |
| 5,296,755 | | 3/1994 | Miyamoto et al. .................. 307/446 |
| 5,298,805 | | 3/1994 | Garverick et al. .................. 307/465 |
| 5,313,079 | | 5/1994 | Brasen et al. ....................... 257/206 |
| 5,313,101 | | 5/1994 | Harada et al. ....................... 257/758 |
| 5,314,832 | | 5/1994 | Deleonibus .......................... 437/27 |
| 5,341,049 | | 8/1994 | Shimizu et al. ..................... 307/482.1 |
| 5,388,055 | | 2/1995 | Tanizawa et al. ................... 364/491 |
| 5,432,707 | * | 7/1995 | Leung .................................. 364/489 |
| 5,444,285 | | 8/1995 | Robinson et al. ................... 257/378 |
| 5,452,245 | * | 9/1995 | Hickman et al. .................... 365/154 |
| 5,541,120 | | 7/1996 | Robinson et al. ................... 437/31 |
| 5,654,898 | * | 8/1997 | Roetcisoender et al. ........... 364/490 |
| 5,869,900 | | 2/1999 | Crafts ................................... 257/758 |

OTHER PUBLICATIONS

A Design–System for ASIC's with Macrocells; B. Korte et al.; IEEE, Euro ASIC '90; 1990; pp. 220–224.

GaAs MESFET and Si CMOS Cointegration & Circuit Techniques; H. Shichijo et al.; IEEE, GaAs IC Symposium; Sep. 1988; pp. 239–242.

* cited by examiner

FIG. 1 BACKGROUND

BACKGROUND

BACKGROUND

BACKGROUND

BACKGROUND

METHOD OF CONSTRUCTING AN INTEGRATED CIRCUIT UTILIZING MULTIPLE LAYERS OF INTERCONNECT

This is a Division, of application Ser. No. 08/455,503, now U.S. Pat. No. 5,671,397 filed May 31, 1995 which is a division of application Ser. No. 08/174,654 filed Dec. 27, 1993 now abandoned.

The invention concerns an Integrated Circuit (IC) architecture in which individual transistors, each of which resides in a "sell," are arranged in a matrix-like array, thereby forming a "sea" of the cells.

Groups of the cells are interconnected among themselves, by local interconnect, into functional units. (Some of these units are called "MACROs.") The local interconnect in the units is prohibited from occupying certain layers, such as second-layer metal. The prohibited layer is used instead to connect the individual units to each other.

BACKGROUND OF THE INVENTION

Several practices, common in the prior art, tend to utilize resources in integrated circuits (ICs) in an inefficient manner. These are:

1. The use of metal level 2 for local interconnect.
2. The use of metallization located above a row of transistors for interconnect for other transistors, rendering the row of transistors non-usable.
3. The use of a cell spacing (or "row pitch") in a MACRO which is different from that of the rest of the array of standard cells into which the MACRO is embedded.

These practices will be addressed individually.

Metal Level 2 is Used for Local Interconnect
CMOS Inverters Generally

FIG. 1 illustrates a common approach to constructing a CMOS inverter. A p-well and an n-well are constructed in a silicon substrate 3. A gate G, commonly made of polysilicon, extends across the wells.

In the p-well, an electric field produced by the gate G generates an n-type channel (not shown) in which electrons flow from a source S to a drain D. In the n-well, this electric field generates an opposite type of channel, namely, a p-type channel (not shown), in which holes flow from a source S to a drain D. This electric field modulates the flow of the electrons and holes, and thus modulates the current flowing through the inverter.

Electric power for the inverter is provided by bus lines Vss and Vdd. These bus lines are generally fabricated in first-layer metal, or METAL 1 in FIG. 2. ("TPOLY" in that Figure refers to polysilicon.)

Trace T is Generally Located in METAL 2

The two drains D in FIG. 1 are connected by an interconnect trace T. The Inventor herein has observed that this trace T is fabricated using second-layer metal, which is labeled METAL 2 in FIG. 2. Locating this trace T in METAL 2 presents obstacles to routing other traces, as FIG. 3 illustrates. For example, trace TT cannot take the path shown, because trace T blocks the way. Thus, the freedom of routing of traces such as TT is limited by the local interconnect traces T.

(FIG. 1 has been simplified for ease of illustration. Insulating layers are not shown, and the vias V have been simplified. FIG. 4 illustrates a more detailed view. Vias are not pure vertical columns, as in the simplified FIG. 1, but, for various technical reasons, take the form shown in FIG. 5.)

When Macros are Embedded, the Power Busses Become Disrupted

Standard Cell Arrays Generally

The cells of a standard cell array typically contain a simple logic function, such as an inverter, a NAND gate, or a D-flip flop. The transistors in these cells are specifically designed for the drive requirements of the particular cell, and spacing of these transistors depends upon such factors as the location of contacts within the cells.

The spacing, or pitch, between rows of cells is determined by (a) the number of interconnect lines fabricated from METAL 1 (shown in FIG. 2) and (b) the cell height. The cell height, in turn, depends upon the transistor configuration within the cells. FIG. 6 illustrates these terms.

The interconnect lines fabricated from METAL 1 are typically laid out by an automated device, or computer program, called a "router," or "auto-router." Different routers have different algorithms for laying out the lines, so that different routers will produce different interconnect patterns, even though the end result of the connections may be the same.

Thus, in general, the row pitch is determined by (a) the router used to interconnect the cells in the standard cell array and (b) the height of the individual cells.

Wiring is Primary Consumer of Space

It is very important to efficiently arrange the wiring in an IC because, in general, the wiring running from transistor-to-transistor consumes more space than the transistors themselves. (The wiring consists of traces fabricated from the METAL layers shown in FIG. 2.) Restated, the size of the IC is generally determined by how efficiently the wiring can be routed and compacted, and not by how many transistors the IC contains.

In a standard cell array, such as that shown in FIG. 6, when more wiring is needed, it is common to use the METAL, shown in FIG. 2, which is located between rows of cells in FIG. 6, such as at location L1. If additional METAL 2 is required, the cells are then spaced apart, as shown in FIG. 6, so that metal lines can be run between them, as indicated.

Embedding MACROs into Standard Cell Arrays Wastes Space

MACROs are frequently incorporated into ICs containing standard cell arrays. A MACRO is a block of transistors which have been optimized to perform a specific function. In a MACRO, the layout of the individual transistors, their operating characteristics, and their interconnections may have all been matched to each other for optimum performance. Thus, typically, a MACRO is constructed from different sizes of transistors, which are embedded into the standard cell array as shown in FIG. 7.

Since, in general, the ROW PITCH of the MACRO is different from that of the standard cell array, the power busses Vdd and Vss will be interrupted. To accommodate this interruption, the power busses are re-designed as a ring which surrounds the MACRO. FIG. 7 shows such a ring generically.

Recapitulation

Therefore,

1. The use of METAL 2 for local interconnect presents obstacles to the free routing of other interconnects over the cell, as illustrated in FIG. 3.
2. In a standard cell array, the ROW PITCH is determined by the cell height and the number of lines of METAL 1 interconnect placed between the cell rows by the auto-router.

3. The row pitch in a MACRO is generally different from that of a standard cell array into which the MACRO is embedded. This different row pitch disrupts the power bus system, requiring a ring of power busses to be formed around the MACRO. This approach wastes space within the IC.

OBJECTS OF THE INVENTION

It is an object of the invention to provide an improved approach to the layout of an integrated circuit.

It is a further object to provide a method of compacting interconnections in integrated circuits.

It is yet a further object of the invention to provide a method for improving the performance of the integrated circuit after the layout has been completed, without requiring a new layout to be generated.

SUMMARY OF THE INVENTION

In one form of the invention, a MACRO, when embedded within a standard cell array, uses the same row pitch as that of the standard cell array itself.

In another form of the invention, the interconnect within the standard cell is confined to METAL 1 and polysilicon layers, so that METAL 2 is free for routing over the cell.

In still another form of the invention, the diffusion layer of the transistors within the standard cells is designed for optimum performance after the layout has been completed, rather than at another time.

BRIEF DESCRIPTIONS OF THE DRAWINGS

Figure 4:
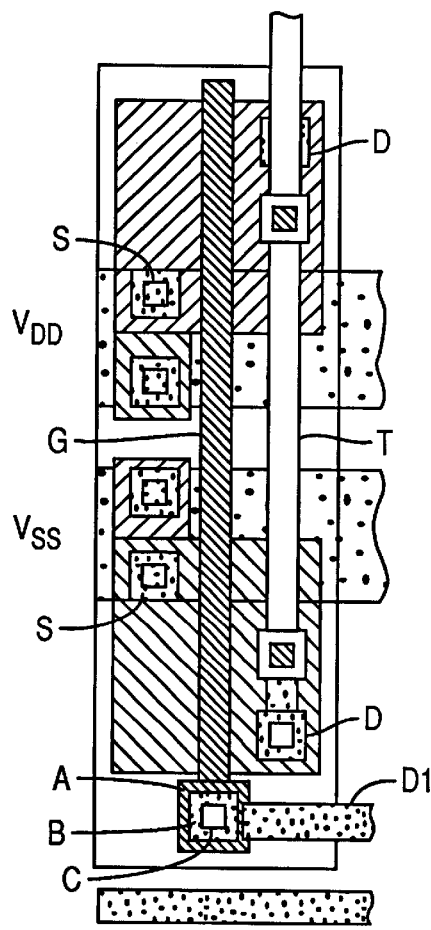
FIG. 4 illustrates the CMOS inverter of FIG. 1, but in greater detail.
Figure 5:
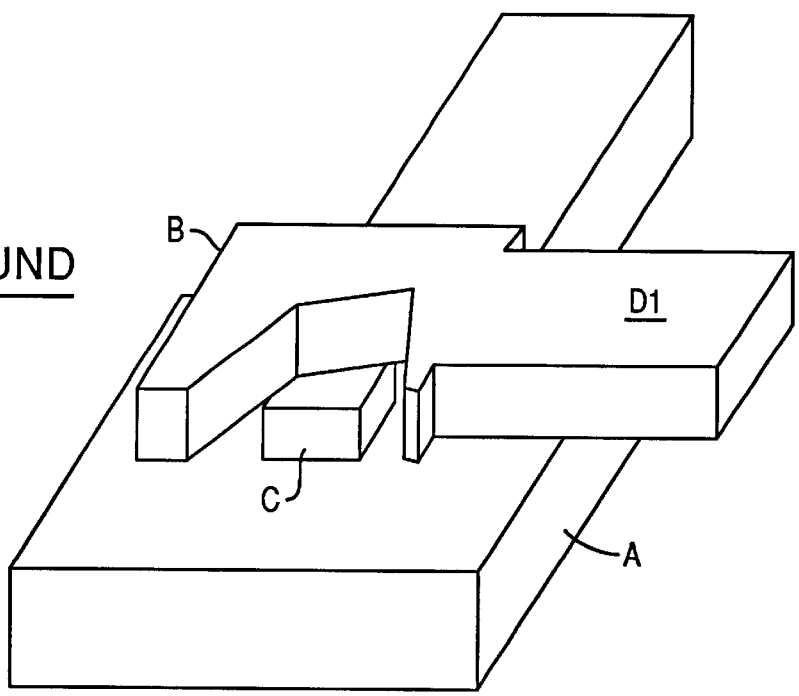

FIG. 5 is a highly simplified depiction of a via of FIG. 4. Like-numbered structures correspond in both Figures. In an actual via, the metal in the via C is a portion of element D1. The outline C in FIG. 5 is the cutout in the dielectric layer. Metal layer D1 flows down into the via C.

Figure 6:
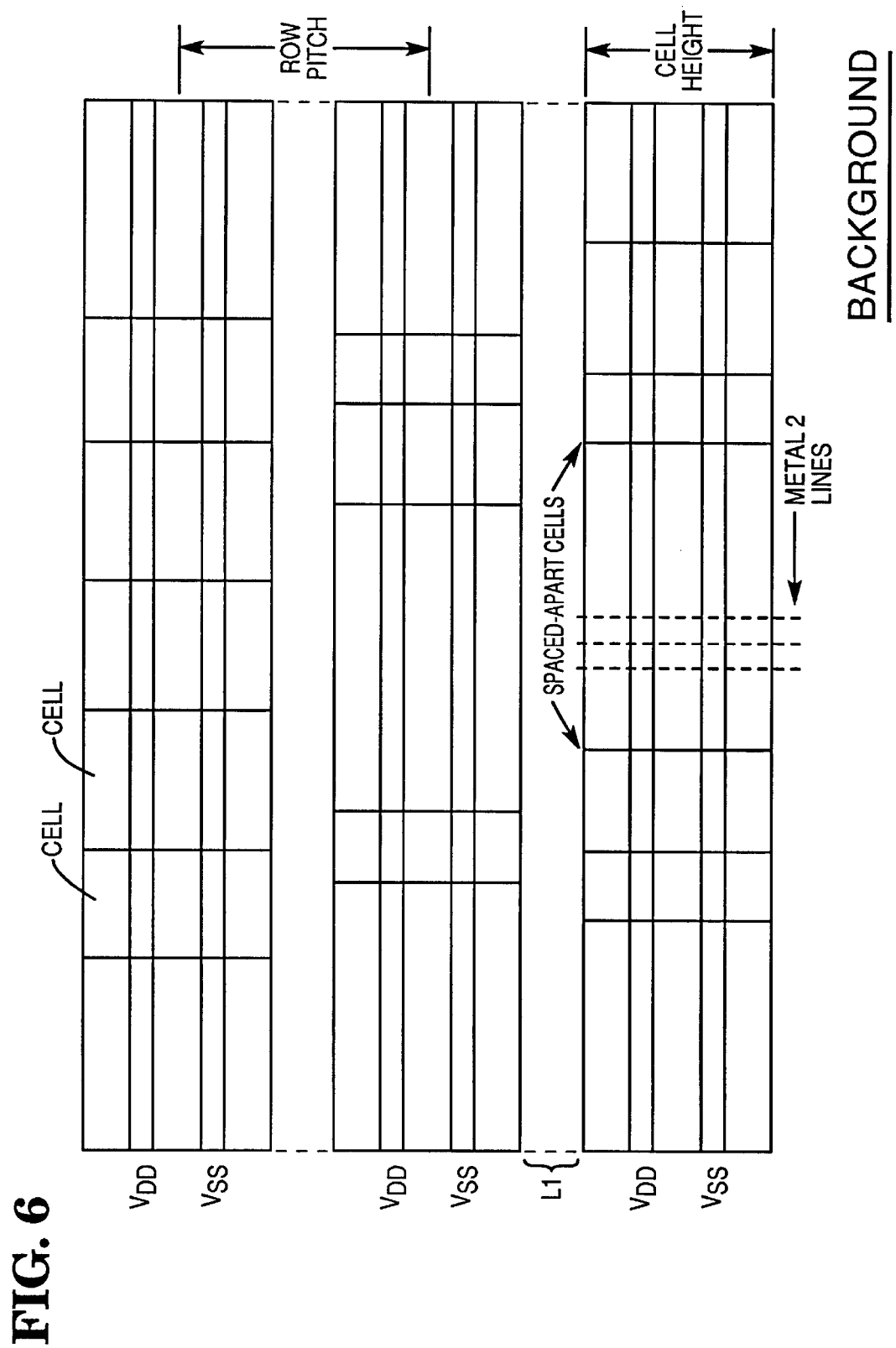

FIG. 6 illustrates a standard cell array.

Figure 7:
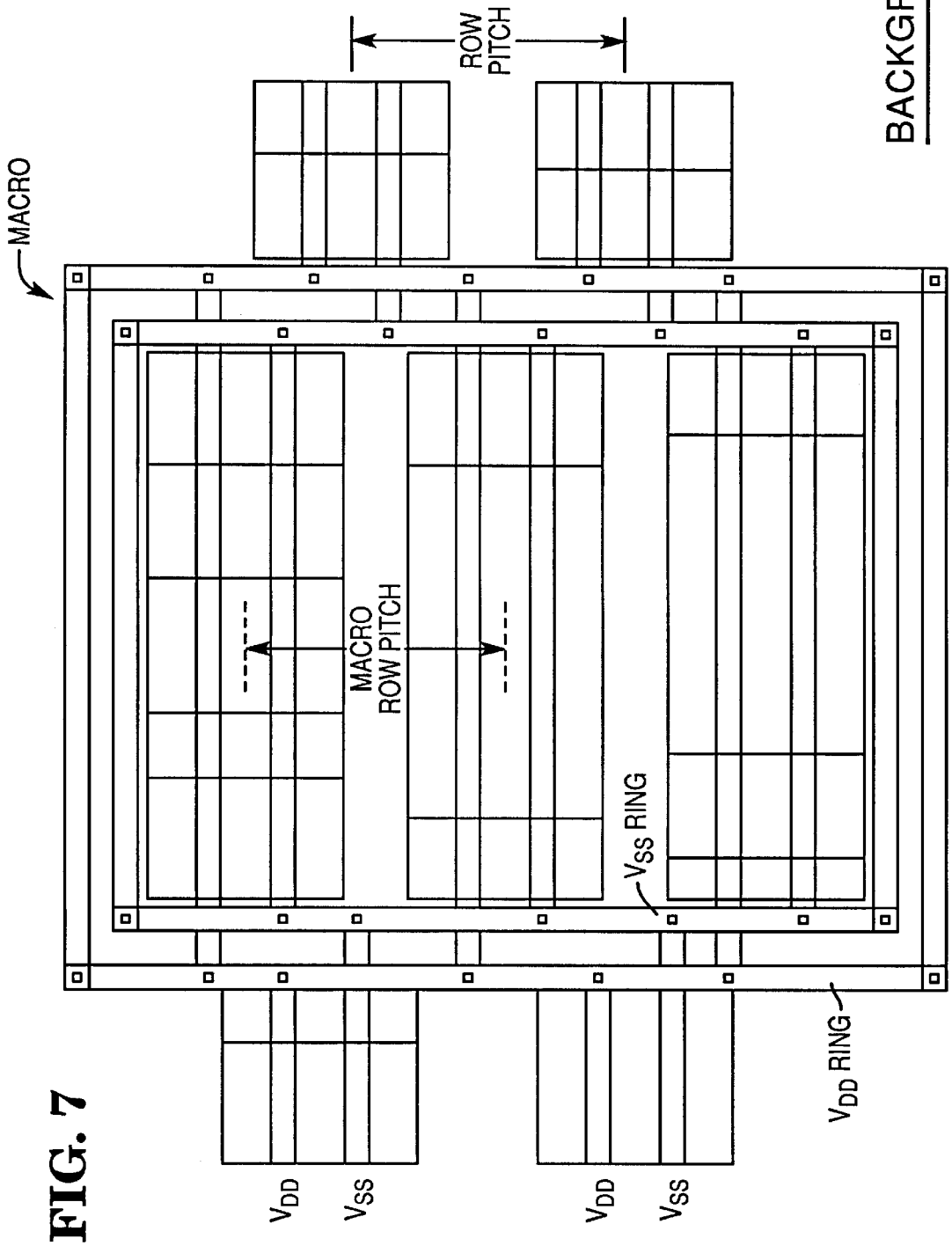

FIG. 7 illustrates a common approach to embedding a MACRO in a standard cell array.

Figure 8:
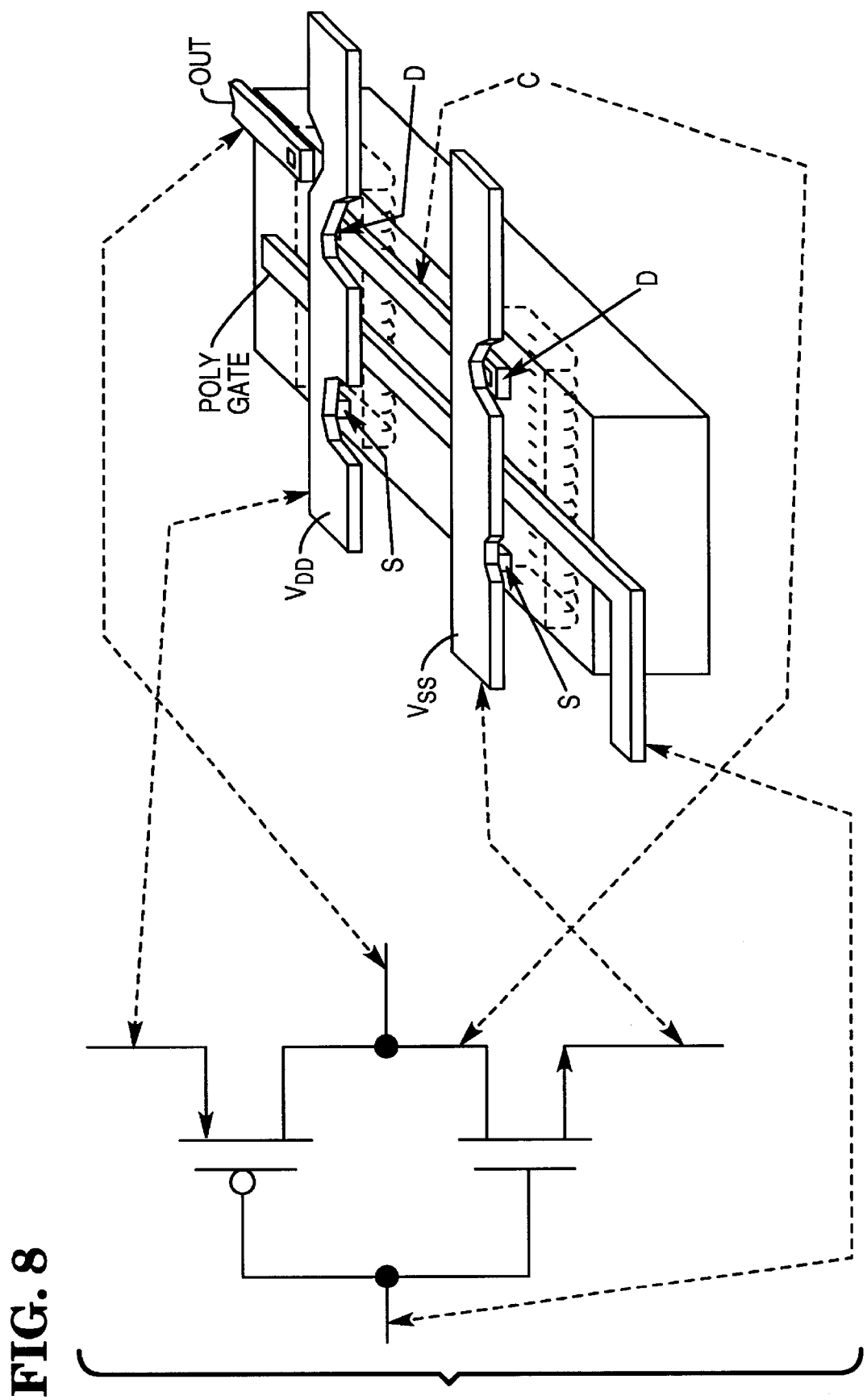

FIG. 8 illustrates one form of the invention.

Figure 9:
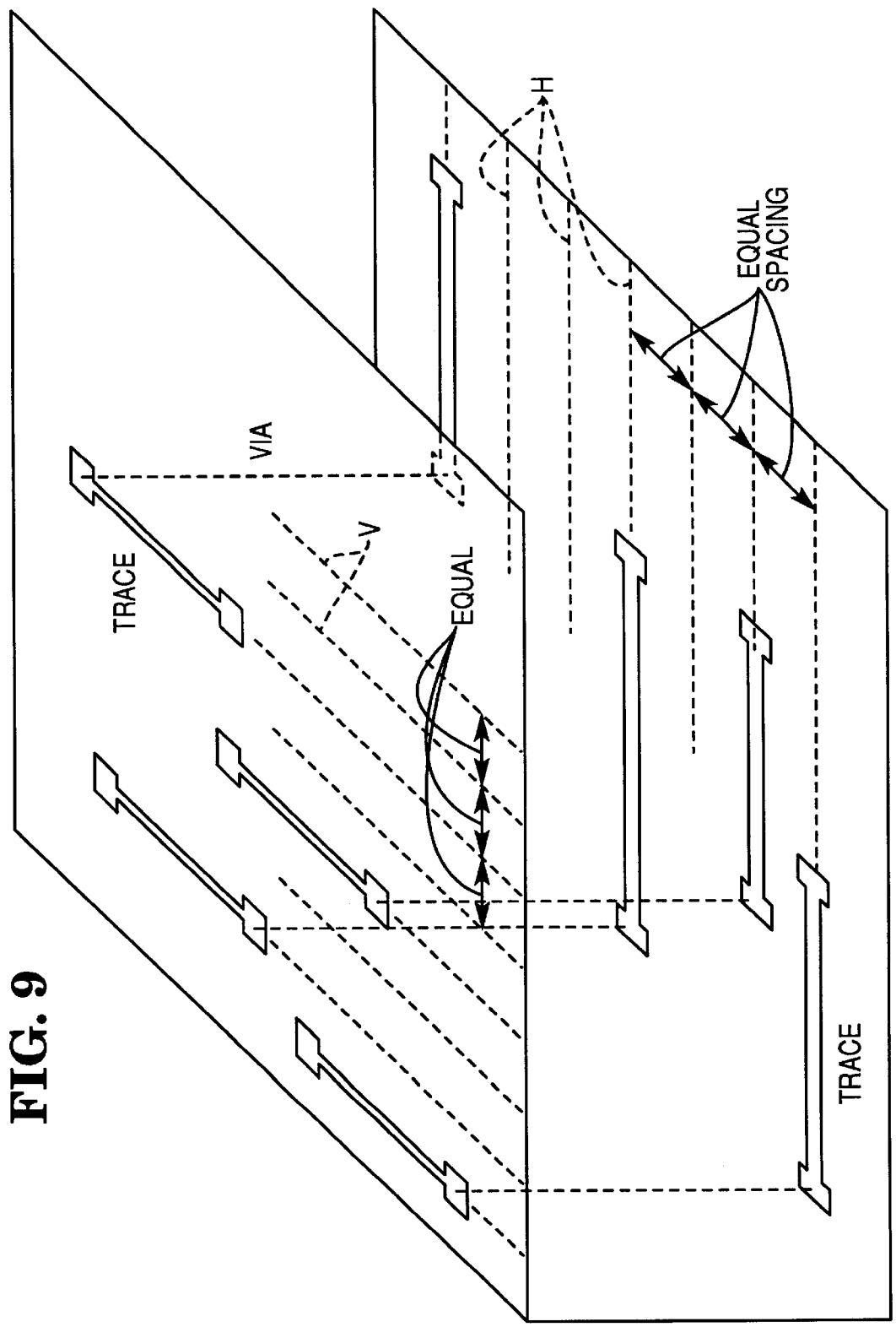

FIG. 9 illustrates an imaginary grid on which traces are laid out in the prior art.

FIGS. 10A, 10B, 10C, and 10D illustrate the different effective widths of different traces.

Figure 1:
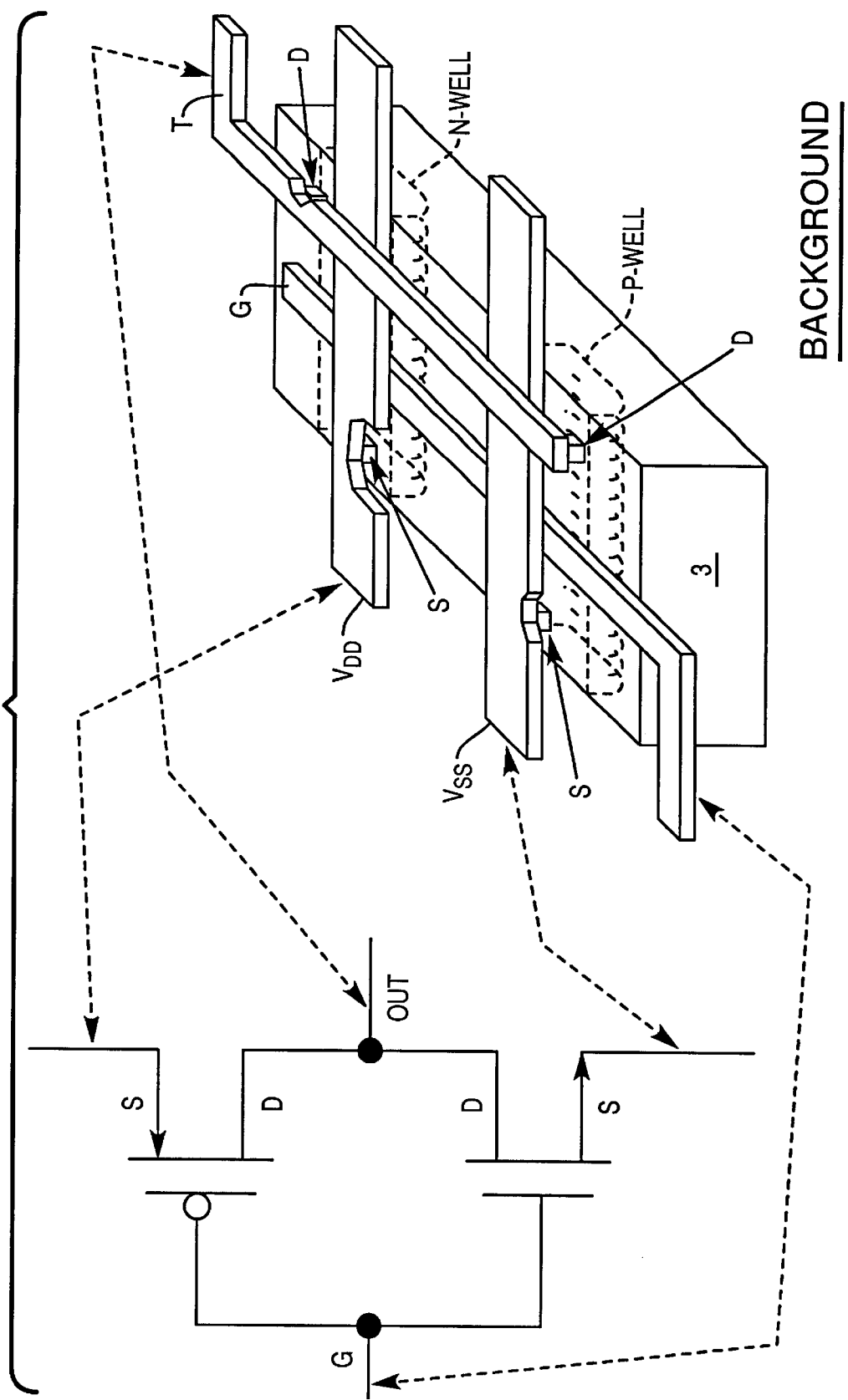
FIG. 1 illustrates a CMOS inverter of the prior art.
Figure 3:
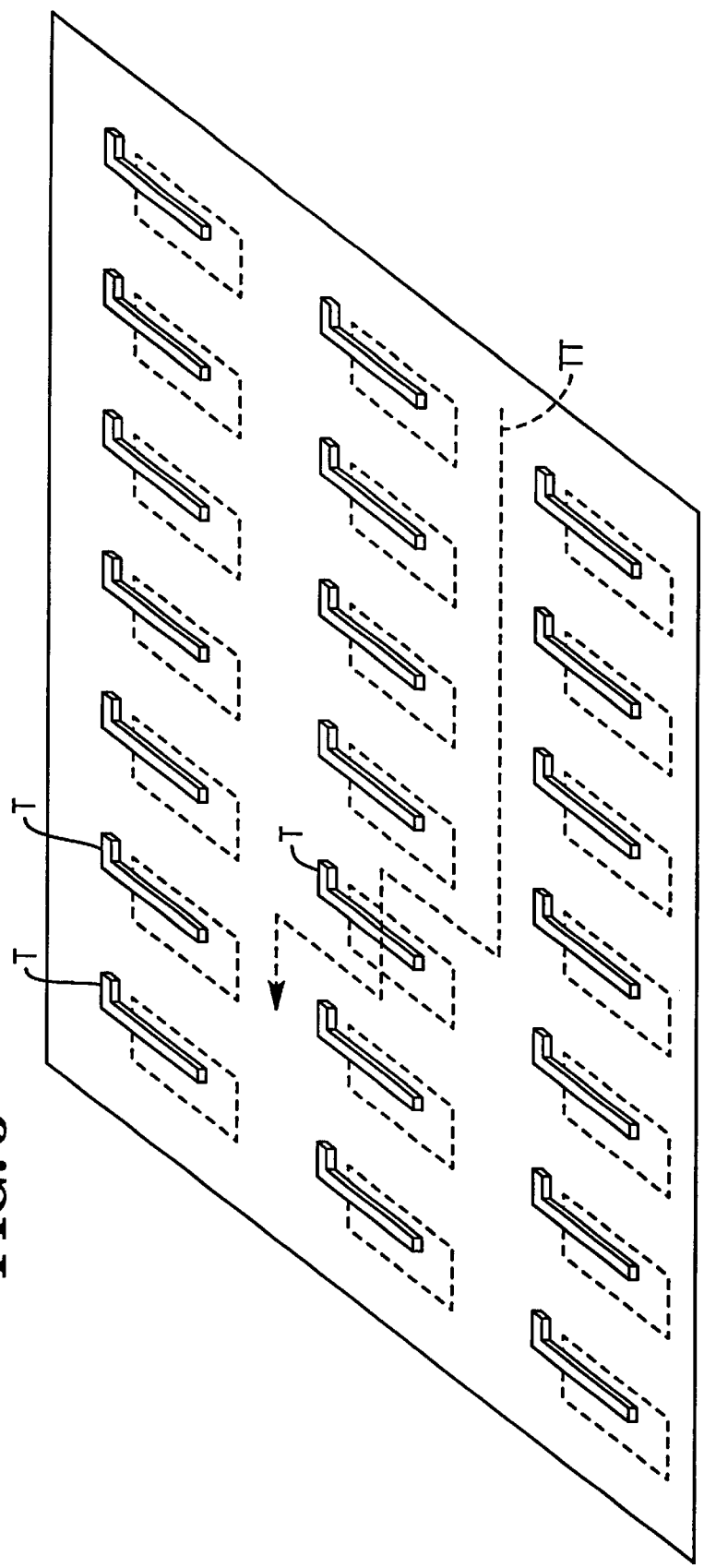
FIG. 3 illustrates the proliferation of traces T, shown in FIG. 1, which can occur when trace T is fabricated in a layer of metallization, such as METAL 2 in FIG. 2.
Figure 11:
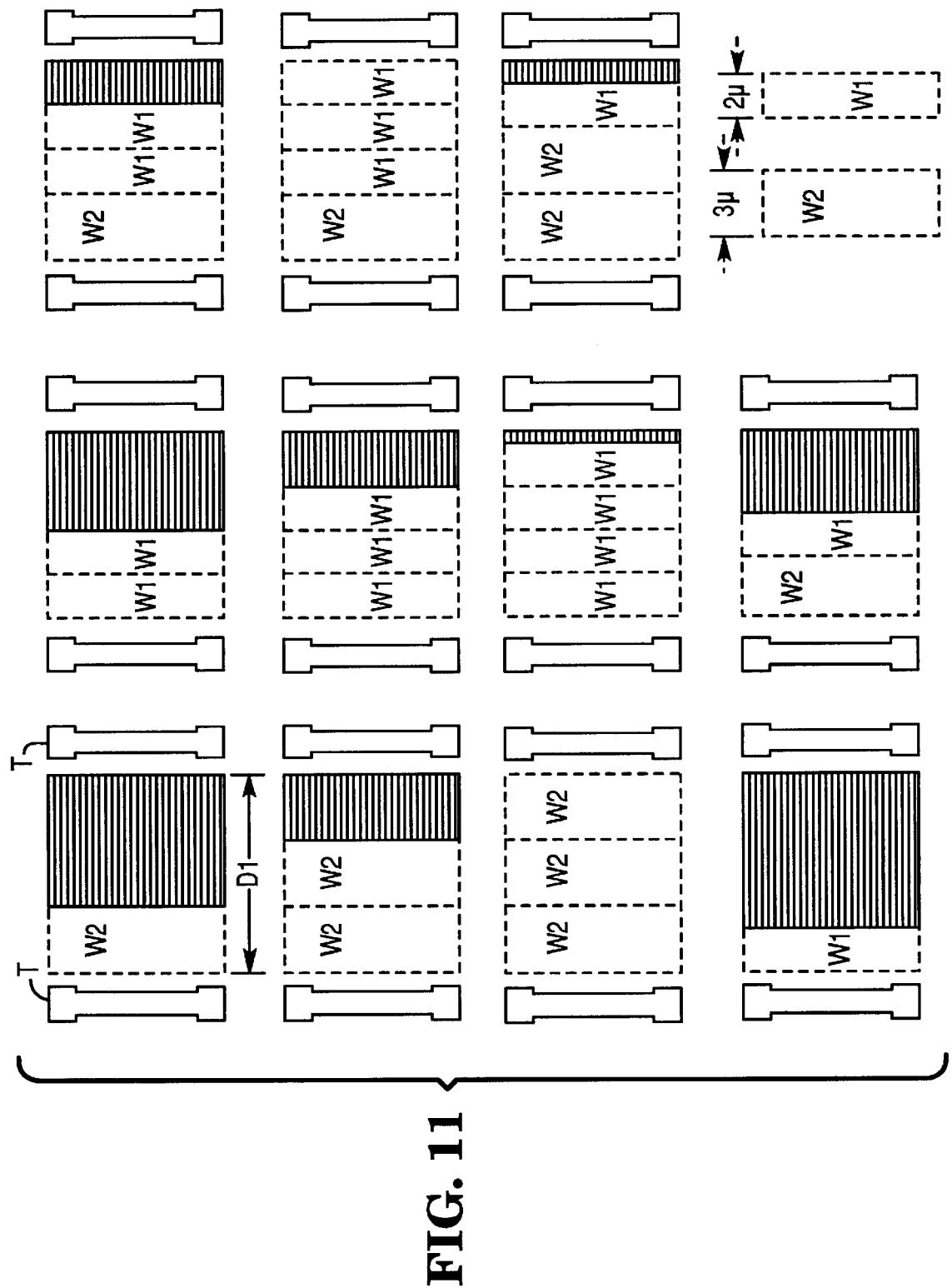

FIG. 11 illustrates different possible ways to pack different traces, of different effective widths, between the traces T of FIGS. 1 and 3.

Figure 12:
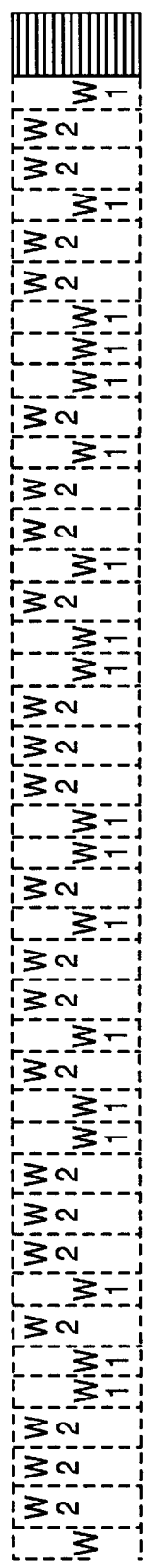

FIG. 12 illustrates how different traces of different effective widths can be packed on a layer of metallization which lacks the traces T of FIG. 3.

Figure 13:
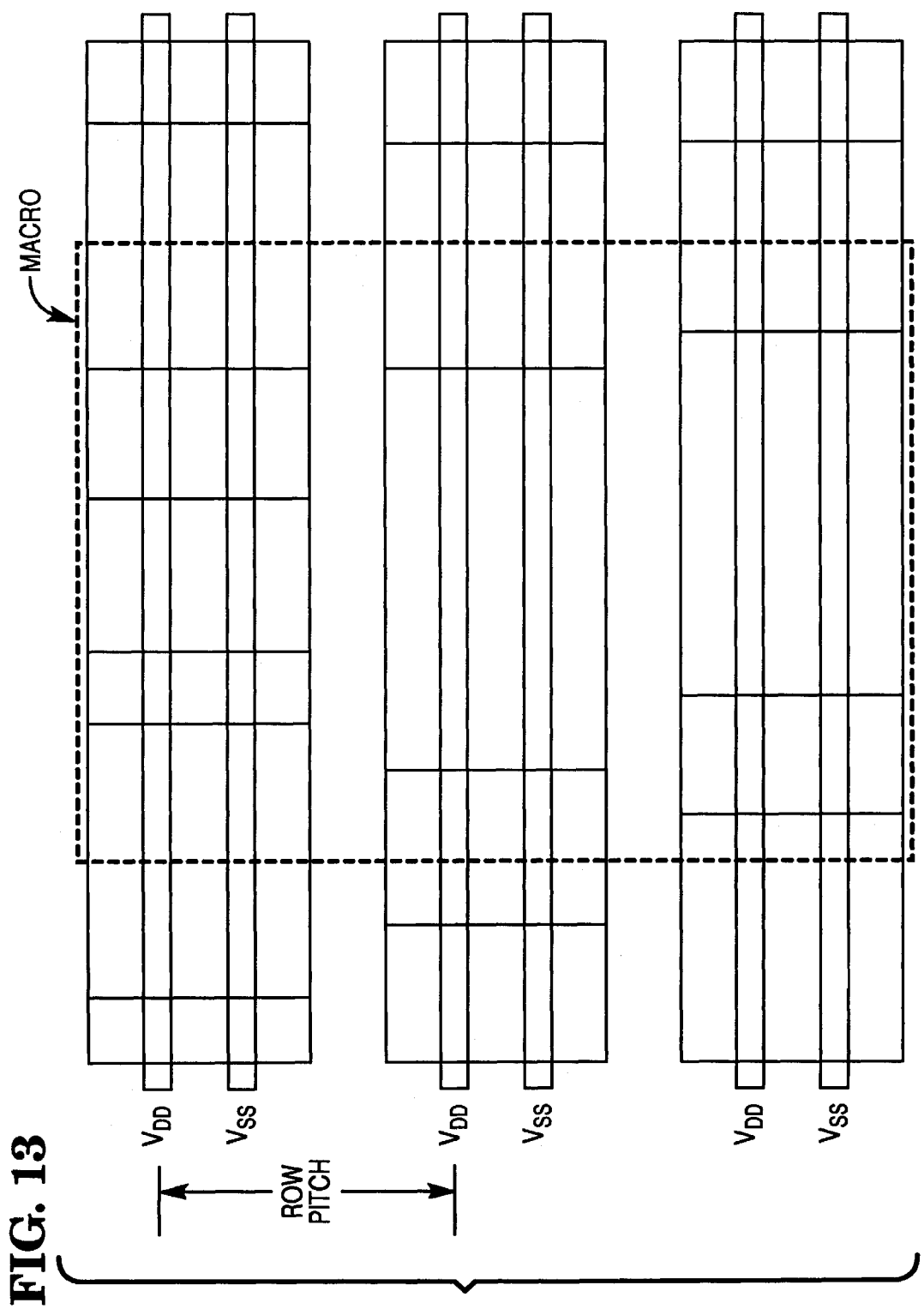

FIG. 13 illustrates embedding of a MACRO into a standard cell array, according to the invention.

Figure 14:
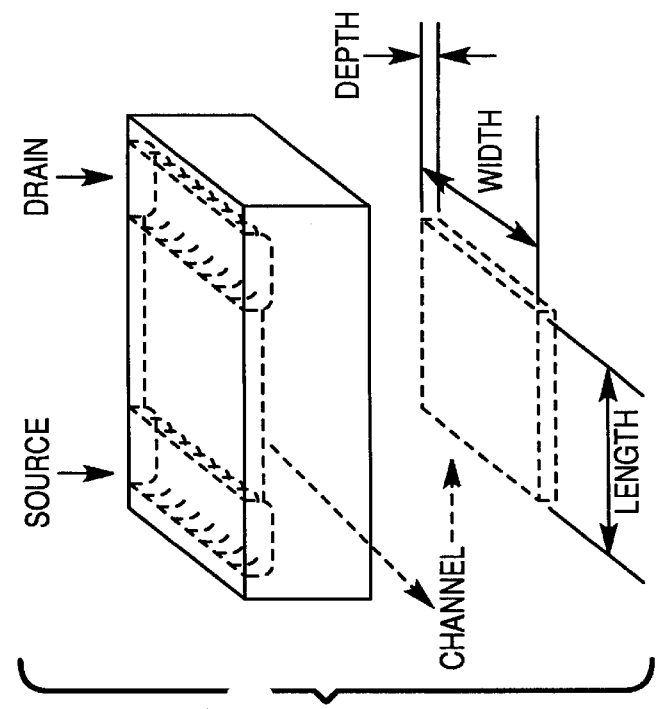

FIG. 14 illustrates the WIDTH of the CHANNEL of a field-effect transistor.

Figure 15:
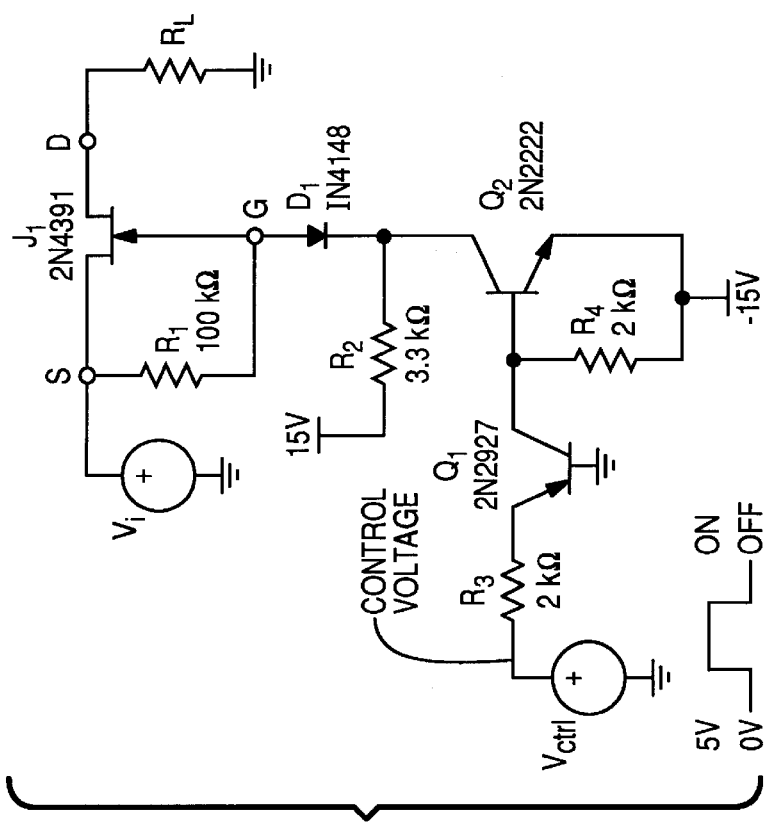

FIG. 15 illustrates an analog switch of the prior art.

DETAILED DESCRIPTION OF THE INVENTION

Fabricate Drain-Drain Local Interconnect in Polysilicon

FIG. 8 shows an inverter, which performs the inversion function, as does the inverter of FIG. 1. However, in FIG. 8, the connection C between the drains D is fabricated from the same polysilicon layer as the gate G. Trace C and the gate G are coplanar. The polysilicon layer is labeled POLY in FIG. 2.

Using polysilicon for this interconnect eliminates the trace T in FIG. 1 which occupies METAL 2. (FIG. 3 illustrates a proliferation of these traces T on METAL 2.) With trace T eliminated, the entire layer of METAL 2 can now be used for routing traces which interconnect MACROs and other functional blocks. This new availability of METAL 2 provides a significant increase in area available for traces, for two major reasons, as will now be explained.

First, the metal traces on a given layer are generally parallel, as shown in FIG. 9. Traces on different layers are connected by vias, indicated by the dashed lines. It can be shown, based on simple assumptions, that, after clearing of METAL 2 of traces T in FIG. 3, the number of metal traces which can be fabricated on METAL 2 is thereby increased by about thirty percent. One contributor to this thirty percent value is the fact that the space formerly occupied by traces T is now available for use, whereas previously it was not.

Second, an additional benefit will be explained by first explaining a situation common in the prior art. Different traces can possess different effective widths. For example, in FIG. 10, trace T1, which contains no associated pads for via connections, has an effective width equal to its own width W1. In this example, W1 is assumed to be 1.0 micron, as indicated. (However, in reality, W1 is typically 0.5–2.0 microns.)

In contrast, trace T2 does contain via-pads P. Its effective width is larger, and equal to the via-pad width W2. In this example, W2 is assumed to be 2.0 microns, as indicated. (However, in reality, W2 is typically 1.0–4.0 microns.)

Figure 10A:
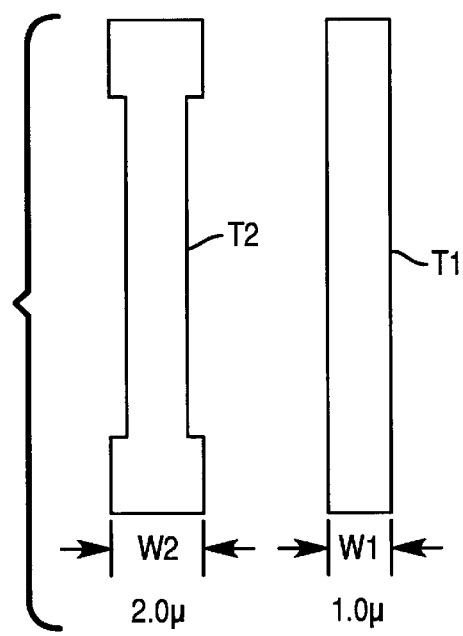
Figure 10B:
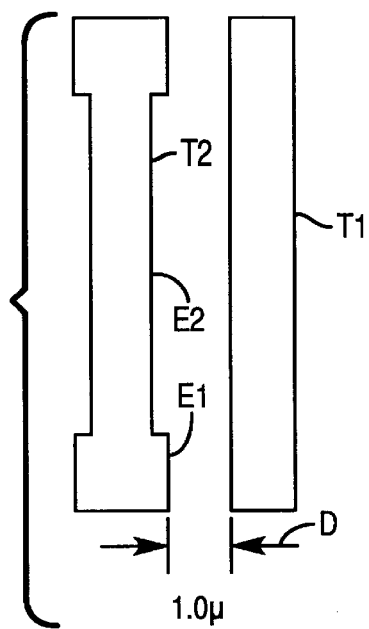

A minimum separation D in FIG. 10B must exist between adjacent traces. The minimum separation D is based on effective widths, determined by an edge such as E1, and not by edge E2. A distance D of 1.0 microns will be assumed. (In reality, a spacing D of 0.5–2.0 microns, for traces of 0.5–2.0 microns width, is common.)

Figure 10C:
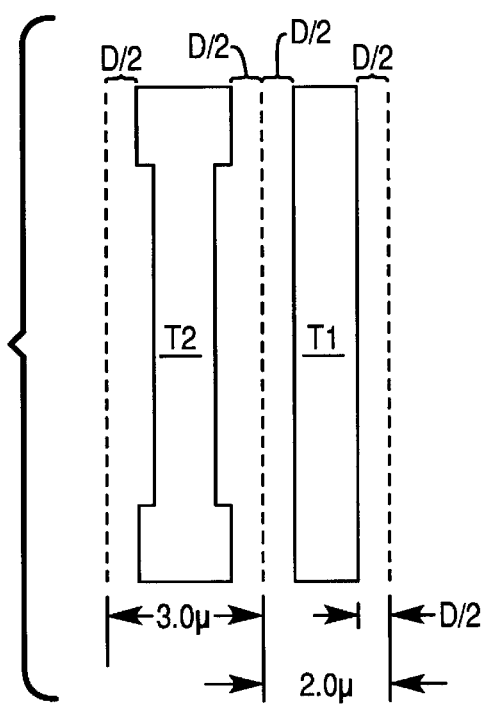
Figure 10D:
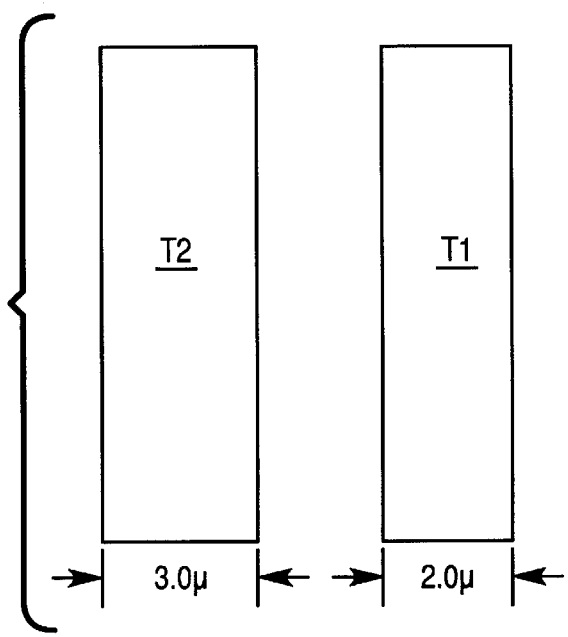

This spacing D can be allocated to each trace, by attributing one-half to each side of a trace, as shown in FIG. 10C. The one-half spacing is labeled D/2. Consequently, trace T1, effectively becomes a rectangle which is 2.0 microns wide, as indicated in FIG. 10C; similarly, trace T2 effectively becomes a rectangle 3.0 microns wide.

One must now inquire how many of these rectangles can be packed between the prior-art traces T in FIG. 3.

FIG. 11 illustrates the eleven possible ways to pack traces T2 (of width W2 in FIG. 11) and T1 (of width W1) between traces T. Distance D1 is assumed to be 9.0 microns. The hatched areas represent unused space.

If one assumes that each of the eleven possible combinations is equally likely to occur in an actual integrated circuit, then the average wasted space is the numerical average of the hatched areas. A statistical analysis of a given IC layout can be undertaken to ascertain the actual probabilities of each combination, and may produce a different answer than a simple numerical average of the possibilities in FIG. 11. Nevertheless, it is reasonable to assume that the combinations which leave no wasted space, namely, W2-W2-W2 and W2-W1-W1-W1, will never occur with 100 percent frequency; some wasted space will always occur.

Figure 2:
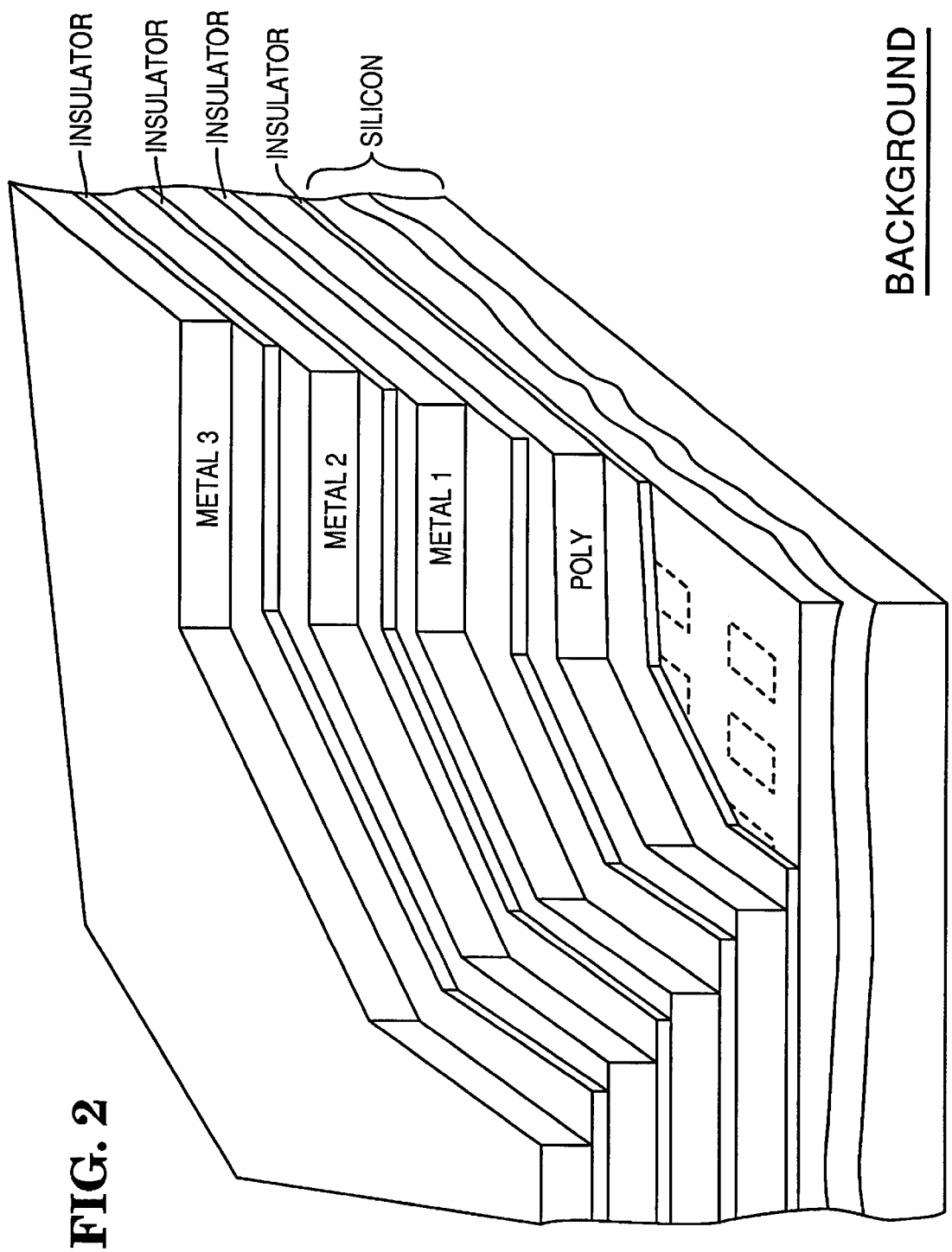
FIG. 2 illustrates the different layers of. metallization used in IC fabrication.

FIG. 12 illustrates how the traces can be packed onto METAL 2 layer shown in FIG. 2, when the traces T in FIG. 3 have been eliminated. The traces T1 and T2 can be packed with maximum density. The only space which is left over is the hatched area at the right. It is clear, based on simple observation, that the wasted space in FIG. 12 is less than that in FIG. 11.

Further, based on reasonable assumptions, it can be calculated that the total wasted space in FIG. 12 will be about 40 percent of the wasted space in FIG. 11.

Therefore, by fabricating the trace T in FIG. 8 from polysilicon, in the same polysilicon layer as the gate G, the prior art array of traces T in METAL 2 in FIG. 3 has been eliminated. This elimination provides a thirty percent increase in space, due to factors which include the recovery of the space occupied by the traces T themselves. This elimination further provides a forty percent reduction in waste, by allowing packing of the type shown in FIG. 12 to be attained, as opposed to that of FIG. 11.

If Uniform Spacing is Required in Prior Art, Waste is Even Greater

The eleven possibilities shown in FIG. 11 may not all be available. For example, some routing techniques, both computer-executed and manual, follow a rule which requires that all traces lie upon imaginary lines of fixed, uniform spacing, such as the lines H and V in FIG. 9. Under such a rule, several possibilities in FIG. 11 would not be available. For example, any possibility which mixes W1 with W2 would be unavailable, (because spacing is not equal with this mixing).

Further, other rules are even more restrictive, and require that the traces be laid out on a grid having the largest spacing, which would equal W2 in FIG. 10A. Under this rule, only three possibilities of FIG. 11 would be available, namely, (1) W2,
(2) W2-W2, or
(3) W2-W2-W2.

The other 8 possibilities are not available.

Under either of these two rules, some of the possibilities of FIG. 11 are eliminated. It is clear that, under the added restrictions, the total wasted space becomes greater than if these possibilities were allowed.

Use Same Row Pitch For MACRO Embedded in Standard Cell Array

In a second aspect of the invention, a MACRO is embedded within a standard cell array using the same ROW PITCH in the MACRO as in the array, as indicated in FIG. 13. The different sizes indicate that the MACRO's cells need not be the same size as the standard cell array's, although they can be.

Under this layout, the same power busses, Vdd and Vss, feed both the MACRO cells and the standard cell array cells. Further, preferably, within the MACRO, no local interconnect is made on metal level 2 (labeled METAL 2 in FIG. 2). That is, within the MACRO, there are no traces such as T shown in FIG. 3 located on metal level 2. Stated again, metal level 2 within the MACRO is preferably free of local interconnect.

This absence of local interconnect allows great flexibility in routing chip interconnect across the MACRO and also allows compaction of the interconnect into very small spaces which are located over the MACRO;

Optimize Channels in FETs After Layout

The transistors used contain channels, through which carriers flow from source to drain. One channel is shown in FIG. 14. It is possible to fabricate channels having different WIDTHs, by adjusting the masking used in fabrication. Different WIDTHs result in different associated capacitances, such as the gate capacitance, and also result in different transconductances.

Different capacitances can be desired for different transistors. For example, the channel in a transistor used as a load preferably has a narrow WIDTH, to minimize capacitance. Conversely, the channel in a transistor used as a driver (of a load) preferably has a wider WIDTH, to maximize transconductance.

Under the invention, a given integrated circuit is laid out, using the above principles, including (a) the clearing of METAL 2 of local interconnect, and (b) the use of the same ROW PITCH in a MACRO and a standard cell array in which the MACRO is embedded. Then, the capacitances of selected transistors are computed. (The capacitances cannot be calculated before this time, because the capacitance of each transistor depends on the traces leading to the transistor, as well as on the traces running next to, and over, it.)

If this computation indicates that some capacitances are not optimal, then the WIDTHs of the channels of the non-optimal transistors can be changed. The WIDTHs of load transistors can be reduced, and the WIDTHs of driver transistors can be widened.

The inventor notes that the trimming is probably limited by a factor of about three. That is, if the smallest WIDTH possible is used initially, then it is probable that the WITH cannot be increased by greater than a factor of three. Conversely, if the largest possible WIDTH is used initially, then it is probable that the WIDTH cannot be reduced by greater than a factor of ⅓. The primary reason is that the maximum WIDTH must lie within the cell boundaries (cells are shown in FIG. 3), and the minimum WIDTH is limited by the minimum masking dimensions available.

Therefore, under the invention,
  (a) METAL 2 is freed of local interconnect, partly by constructing drain-drain interconnect within the polysilicon layer (POLY in FIG. 2).
  (b) MACROs have no local interconnect within METAL 2.
  (c) When MACROs are embedded within standard cell arrays, they are given the same ROW PITCH as the standard cell array itself.
  (d) After layout (which is a conceptual step, done either on paper or by computer) and before fabrication, the relevant capacitances of selected (or all) transistors is computed. If any capacitances are non-optimal, the channel WIDTH is reduced or increased, as appropriate.

Invention Allows Non-Uniform Spacing of Interconnect

Typical Prior-Art interconnect traces are positioned on an x-y grid of fixed spacing. That is, as shown in FIG. 9, all horizontal traces must run along horizontal dashed lines H, and all vertical traces must run along vertical dashed lines V. (As a consequence, since all vias must lie upon an intersection point of a horizontal trace and a vertical trace, the vias will lie on a grid point GP.)

In contrast, under the invention, the spacing of the traces can be non-uniform. FIG. 12 illustrates the non-uniform spacing.

Additional Considerations

1. "Local Interconnect" refers to signal traces which run between two locations in a given functional block of transistors, or other components. As an example, FIG. 15 illustrates an analog switch. (The discussion above has presumed standard cell arrays of CMOS devices; FIG. 15 shows BJTs. The appearance of BJTs is purely incidental.) All of the interconnections in that Figure are "local interconnects," with two exceptions:

(1) The power and ground lines are not considered local interconnect, because the term is not applied to such lines.

(2) The line carrying the CONTROL VOLTAGE is not a local interconnect, because it carries the actuation signal for the analog switch. In general, this actuation signal will originate at a location which is unrelated to, and independent of, the location of the analog switch.

Therefore, FIG. 15 illustrates one definition of "local interconnect." Local interconnect includes traces which carry signals from one component to another within a given functional block, and which assist in the execution of the block's function. The line CONTROL VOLTAGE, which carries the incoming signal, is not local interconnect, because it initiates execution of block's function.

Another definition of local interconnect is again related to functional blocks. Integrated circuit are frequently constructed using MACROs and other functional blocks contained in a library. Each MACRO and functional block can operate isolated, by itself (provided it receives power and input signals). The traces contained within each isolated MACRO and functional block (except power, input and output traces) are local interconnect.

2. The invention applies to integrated circuits having high levels of integration. For example, the invention applies to ICs of overall dimension of 5×5 mm, or greater. Such ICs are fabricated using VLSI/ULSI techniques.

3. The discussion above considered parallel power busses, such as Vdd and Vss in FIG. 6. In the present context, "parallel" does not mean concentric. For example, if a second ring (for Vss) in FIG. 7 were to be fabricated, parallel with the Vdd ring shown, the two rings would not be considered "concentric".

4. In FIG. 13, the power busses Vdd and Vss run parallel, and they are aligned to both the cells of the standard cell array and the cells of tie MACRO.

5. Under the invention, a MACRO having a fixed, predetermined layout. is embedded in a standard cell array. Since the placement does not alter the design of the MACRO, the MACRO's timing is not be affected by this embedding.

6. The final gate width adjustments (or channel width adjustments), discussed above, are accomplished by the use of computer simulations. A series of timing simulations of the circuit are run, in which transistor gate widths are incrementally changed, and the resulting change in the logic timing are observed. If timing is improved, the new increment is likely to be retained. If the timing worsens, the new increment is likely to be rejected.

The simulations are repeated until the widths converge on fixed values. This technique is known in the art as simulated annealing.

7. A third and fourth layer of metal interconnect can be utilized in addition to the interconnect, discussed above, provided by (a) the polysilicon layer, (b) METAL 1 and (c) METAL 2 layers. These additional layers maximize the cell density in the layout by providing layers of metal interconnect that can be freely routed over the cells. That is, these layers are not subject to the restrictions discussed above.

Numerous substitutions and modifications can be undertaken without departing from the true spirit and scope of the invention. What is desired to be secured by Letters Patent is the Invention as defined in the following claims.

What is claimed is:

1. A method of constructing an integrated circuit utilizing a MACRO, comprising:

constucting said integrated circuit from multiple physical layers of interconnect;

providing a standard cell array constructed of transistors, said standard cell array having a power bus;

embedding a MACRO in said standard cell array after said providing a standard cell array;

running a plurality of computer simulations of said MACRO;

changing dimensions of at least one of said transistors in different simulations;

identifying transistor dimensions which provide superior timing performance;

coupling said MACRO to said power bus of said standard cell array;

fabricating said MACRO according to said identified transistor dimensions which provide superior timing performance;

utilizing a second layer of metallization comprising no local interconnect as part of said integrated circuit so as to provide routing flexibility across said MACRO and so as to allow compaction of interconnect into spaces located over said MACRO.

2. The method of constructing an integrated circuit as described in claim 1 wherein said standard cell array comprises a row pitch and wherein said MACRO comprises substantially the same row pitch as that of said standard cell array.

3. The method as described in claim 1 and further comprising:

completing a layout of said standard cell array, said standard cell array having a diffusion layer of said transistors within said standard cell array; before designing said diffusion layer of said transistors for said superior timing performance.

4. The method as described in claim 1 wherein the MACRO comprises a fixed, predetermined layout and a predetermined timing and wherein said timing of the MACRO is not affected by said embedding of the MACRO in said standard cell array.

5. The method as described in claim 1 and further comprising:

incrementally adjusting a transistor dimension over a plurality of successive simulations so as to observe a resulting change in logic timing.

6. A method of constructing an integrated circuit, comprising:

a) providing a standard cell array constructed of transistors, said standard cell array having a power bus;

b) after said providing a standard cell array, embedding a MACRO in said standard cell array;

c) running a plurality of computer simulations of said MACRO;

d) changing dimensions of at least some of said transistors;

e) identifying transistor dimensions which provide preferred timing performance for said integrated circuit;

f) coupling said MACRO to said power bus of said standard cell array; and g) utilizing a second layer of metallization comprising no local interconnect as part of said integrated circuit so as to provide routing flexibility across said MACRO and so as to allow compaction of interconnect into spaces located over said MACRO.

* * * * *

UNITED STATES PATENT AND TRADEMARK OFFICE
CERTIFICATE OF CORRECTION

PATENT NO.    : 6,269,466 B1
DATED         : July 31, 2001
INVENTOR(S)   : Harold S. Crafts It is certified that error appears in the above-identified patent and that said Letters Patent is hereby corrected as shown below:

<u>Column 8,</u>
Line 18, replace "constucting" with -- constructing --

Signed and Sealed this

Twenty-second Day of July, 2003

JAMES E. ROGAN
*Director of the United States Patent and Trademark Office*